(12) United States Patent
Mori et al.

(10) Patent No.: US 9,324,757 B2
(45) Date of Patent: *Apr. 26, 2016

(54) SOLID-STATE IMAGING DEVICE

(71) Applicant: PANASONIC CORPORATION, Osaka (JP)

(72) Inventors: Mitsuyoshi Mori, Kyoto (JP); Yutaka Hirose, Kyoto (JP); Yoshihisa Kato, Shiga (JP); Yusuke Sakata, Osaka (JP); Hiroshi Masuda, Niigata (JP); Ryohei Miyagawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/279,941

(22) Filed: May 16, 2014

(65) Prior Publication Data

US 2014/0246706 A1 Sep. 4, 2014

Related U.S. Application Data

(63) Continuation of application No. PCT/JP2012/007054, filed on Nov. 2, 2012.

(30) Foreign Application Priority Data

Nov. 22, 2011 (JP) ................. 2011-254556

(51) Int. Cl.
*H01L 27/146* (2006.01)

(52) U.S. Cl.
CPC ...... *H01L 27/14636* (2013.01); *H01L 27/1464* (2013.01); *H01L 27/14609* (2013.01); *H01L 27/14689* (2013.01)

(58) Field of Classification Search
CPC .............. H01L 27/636; H01L 27/1464; H01L 27/4609

See application file for complete search history.

(56) References Cited

U.S. PATENT DOCUMENTS 5,936,270 A 8/1999 Kamada
6,417,023 B2 7/2002 Suzuki et al.
(Continued)

FOREIGN PATENT DOCUMENTS

JP 09-246513 9/1997
JP 2000-299453 A 10/2000
(Continued)

OTHER PUBLICATIONS

English translation of International Search Report PCT/JP2012/007054 dated Jan. 8, 2013.

*Primary Examiner* — William Coleman
(74) *Attorney, Agent, or Firm* — McDermott Will & Emery LLP

(57) ABSTRACT

A solid-state imaging device includes: pixels arranged in a matrix, a semiconductor substrate; a first electrode formed above the semiconductor substrate for each of the pixels; a photoelectric conversion film formed on the first electrode, for photoelectric conversion of light into signal charge; a charge accumulation region formed in the semiconductor substrate for accumulating the signal charge generated through the photoelectric conversion in the photoelectric conversion film; a contact plug for electrically connecting the first electrode and the charge accumulation region in a corresponding pixel; a high-concentration impurity region formed on a surface of the charge accumulation region, in a region in contact with the contact plug; a surface impurity region formed on the surface of the charge accumulation region, in a region not in contact with the contact plug; and a low-concentration impurity region formed between the high-concentration impurity region and the surface impurity region.

8 Claims, 6 Drawing Sheets

(56) References Cited

U.S. PATENT DOCUMENTS

| | | | |
|---|---|---|---|
| 6,423,993 B1 | 7/2002 | Suzuki et al. | |
| 7,372,089 B2 * | 5/2008 | Inoue et al. | 257/292 |
| 7,816,752 B2 * | 10/2010 | Mori | 257/446 |
| 7,989,860 B2 * | 8/2011 | Park | 257/292 |
| 8,368,784 B2 | 2/2013 | Yamaguchi | |
| 8,390,036 B2 | 3/2013 | Goto | |
| 8,409,913 B2 | 4/2013 | Katayama | |
| 8,410,533 B2 | 4/2013 | Katayama | |
| 8,552,353 B2 * | 10/2013 | Kobayashi et al. | 250/208.1 |
| 2001/0015435 A1 | 8/2001 | Suzuki et al. | |
| 2009/0166787 A1 | 7/2009 | Park | |
| 2009/0179293 A1 | 7/2009 | Shim et al. | |
| 2011/0019042 A1 | 1/2011 | Yamaguchi | |
| 2011/0024807 A1 | 2/2011 | Katayama | |
| 2011/0049665 A1 | 3/2011 | Goto | |
| 2012/0270364 A1 | 10/2012 | Katayama | |
| 2013/0033628 A1 | 2/2013 | Yamaguchi | |
| 2014/0103400 A1 * | 4/2014 | Sakata | H01L 27/1463 257/222 |

FOREIGN PATENT DOCUMENTS

| | | |
|---|---|---|
| JP | 2009-158930 A | 7/2009 |
| JP | 2009-164604 A | 7/2009 |
| JP | 4444371 B1 | 3/2010 |
| JP | 2011-014808 A | 1/2011 |
| JP | 2011-035095 A | 2/2011 |
| JP | 2011-029337 A | 10/2011 |

* cited by examiner

SOLID-STATE IMAGING DEVICE

CROSS REFERENCE TO RELATED APPLICATIONS

This is a continuation application of PCT International Application No. PCT/JP2012/007054 filed on Nov. 2, 2012, designating the United States of America, which is based on and claims priority of Japanese Patent Application No. 2011-254556 filed on Nov. 22, 2011. The entire disclosures of the above-identified applications, including the specifications, drawings and claims are incorporated herein by reference in their entirety.

FIELD

The present disclosure relates to a solid-state imaging device including plural pixels arranged in an array and each including a photoelectric conversion unit.

BACKGROUND

In recent years, metal oxide semiconductor (MOS) solid-state imaging devices are being mounted in mobile device cameras, in-vehicle cameras, surveillance cameras, and so on.

High-resolution imaging performance is required from such solid-state devices, and miniaturization and higher pixel count are necessary for the solid-state imaging devices. In conventional solid-state imaging devices, the size of a photodiode is also reduced due to pixel miniaturization. With this, there is the problem that sensitivity deteriorates due to a deterioration in saturation signal level and reduced aperture ratio.

A layered solid-state imaging device has been proposed as a solid-state imaging device for solving this problem. In the layered solid-state imaging device, a photoelectric conversion film is stacked on the top surface of a semiconductor substrate. Furthermore, light enters from above the stacked film. In addition, the solid-state imaging device has a structure in which the charge generated in the photoelectric conversion film by photoelectric conversion is read out using a charge coupled device (CCD) circuit or a complementary MOS (CMOS) circuit.

Patent Literature (PTL) 1 describes a conventional layered solid-state imaging device. FIG. 6 is a circuit diagram of a pixel circuit of the solid-state imaging device described in PTL 1. In the pixel circuit illustrated in FIG. 6, a charge accumulation region (FD) and a pixel electrode 15a are electrically connected, and the voltage of the charge accumulation region varies according to the intensity of incident light. Furthermore, the charge accumulation region is also electrically connected to the gate electrode of an amplification transistor 17b. Therefore, with this pixel circuit, it is possible to amplify the amount of voltage change in the charge accumulation region and read out the resulting voltage to the signal line 17d.

In the above-described layered solid-state imaging device, the photoelectric conversion film is formed stacked on the upper portion of a wiring layer used in a read-out circuit and a signal processing circuit, but the charge obtained through photoelectric conversion is accumulated in the charge accumulation region provided in the semiconductor substrate. As such, the charge obtained through the photoelectric conversion is transmitted to the charge accumulation region via a metal plug.

CITATION LIST

Patent Literature

[PTL 1] Japanese Patent No. 4444371

SUMMARY

Technical Problem

However, the conventional technique has the problem that noise increases because crystal defects increase at the contact interface between the charge accumulation region and the metal plug (contact plug) due to the alloying reaction of silicon.

In view of this, the present disclosure provides a solid-state imaging device that reduces noise by suppressing crystal defects caused by an alloying reaction.

Solution to Problem

A solid-state imaging device according to an aspect of the present disclosure is a solid-state imaging device including a plurality of pixels arranged in a matrix, the solid-state imaging device including: a semiconductor substrate; a first electrode formed above the semiconductor substrate for each of the pixels, and electrically isolated from adjacent ones of the pixels; a photoelectric conversion film formed on the first electrode, for photoelectric conversion of light into signal charge; a second electrode formed on the photoelectric conversion film; a charge accumulation region formed in the semiconductor substrate for each of the pixels, and electrically connected to the first electrode in the pixel, the charge accumulation region accumulating the signal charge generated through the photoelectric conversion in the photoelectric conversion film; a reset gate electrode formed for each of the pixels, for controlling formation of a channel in the semiconductor substrate and resetting a potential of the charge accumulation region of the pixel using charge passing through the channel; an amplification transistor formed for each of the pixels, for amplifying the signal charge accumulated in the charge accumulation region in the pixel; a contact plug formed, for each of the pixels, in contact with the charge accumulation region in the pixel, for electrically connecting the first electrode and the charge accumulation region in the pixel; a high-concentration impurity region formed on a surface of the charge accumulation region, in a region that is in contact with the contact plug, the high-concentration impurity region having a conductivity type identical to a conductivity type of the charge accumulation region; a surface impurity region formed on the surface of the charge accumulation region, in a region that is not in contact with the contact plug, the surface impurity region having a conductivity type opposite to the conductivity type of the charge accumulation region; and a low-concentration impurity region formed on the surface of the charge accumulation region, between the high-concentration impurity region and the surface impurity region, and having a conductivity type that is identical or opposite to the conductivity type of the charge accumulation region.

Advantageous Effects

As described above, the present disclosure provides a solid-state imaging device that can reduce noise by suppressing crystal defects caused by an alloying reaction.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT

Figure 1:
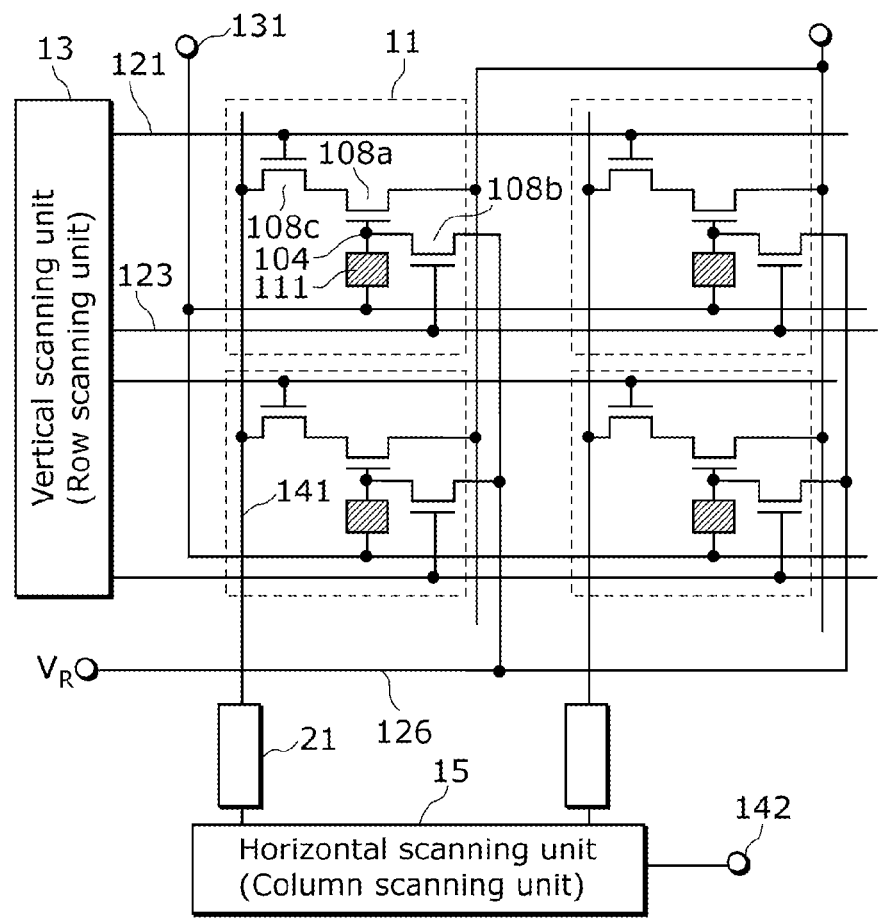
FIG. 1 is a diagram illustrating a solid-state imaging device according to an exemplary embodiment.

Hereinafter, an exemplary embodiment of the present disclosure shall be described in detail with reference to the accompanying Drawings. It should be noted that the exemplary embodiment described below shows a general or specific example and is not limiting, and that the present disclosure is not limited to the following embodiment. The shapes, constituent elements, arrangement of the constituent elements, steps, processing order of the steps, etc. shown in the following exemplary embodiment are mere examples, and therefore do not limit the scope of the appended Claims and their equivalents. The scope of the present disclosure is defined by the Claims. Therefore, among the constituent elements in the following exemplary embodiment, constituent elements not recited in any one of the independent claims are not necessarily required to solve the problem, and are described as arbitrary structural elements. Furthermore, random changes are possible within a scope in which the advantageous effects are produced. In addition, combination with other embodiments is also possible. Furthermore, in the Drawings, elements having substantially the same configuration, operation, and effects are assigned the same reference sign.

Embodiment

A solid-state imaging device according to an exemplary embodiment of the present disclosure uses a semiconductor material for a contact plug for electrically connecting a photoelectric conversion film and a charge accumulation region which are essential in a layered solid-state imaging device. Therefore, alloying reaction in the contact interface between the charge accumulation region and the contact plug does not occur. Accordingly, in this solid-state imaging device, it is possible to reduce crystal defects created at the contact portion between the charge accumulation region and the contact plug, thereby reducing noise.

First, a configuration of the solid-state imaging device according to this embodiment shall be described. FIG. 1 is a diagram illustrating the configuration of the solid-state imaging device according to this embodiment.

As illustrated in FIG. 1, the solid-state imaging device according to this embodiment includes: a semiconductor substrate; plural pixels 11 arranged in a matrix on the semiconductor substrate; a vertical scanning unit (also called a row scanning unit) 13 which supplies various timing signals to the pixels 11; a horizontal scanning unit (also called a column scanning unit) 15 which sequentially reads-out the signals of the pixels 11 to a horizontal output terminal 142; column signal lines 141 formed on a per column basis; and reset lines 126 formed on a per column basis for resetting the pixels 11 to a dark state (i.e., setting the potential of the charge accumulation region of the pixel 11 to the reset potential). It should be noted that, although only "two rows and two columns" of the pixels 11 are illustrated in FIG. 1, the number of rows and columns may be set arbitrarily.

Furthermore, each of the pixels 11 includes: a photoelectric conversion unit 111; an amplification transistor 108a having a gate connected to the photoelectric conversion unit 111; a reset transistor 108b having a drain connected to the photoelectric conversion unit 111; and a selection transistor 108c connected in series with the amplification transistor 108a.

The photoelectric conversion unit 111 includes a photoelectric conversion film for performing photoelectric conversion, a pixel electrode formed on the surface of the photoelectric conversion film facing the semiconductor substrate, and a transparent electrode formed on the opposite surface of the photoelectric conversion film. The photoelectric conversion unit 111 is connected between the gate of the amplification transistor 108a and the drain of the reset transistor 108b, and a photoelectric conversion unit control line 131. The amplification transistor 108a has a gate connected to the pixel electrode, and outputs a signal voltage that is in accordance with the voltage of the pixel electrode, to the column signal line 141 via the selection transistor 108c. One of the source and the drain of the reset transistor 108b is connected to the pixel electrode, and the other of the source and the drain is connected to the corresponding reset line 126. The gate of the selection transistor 108c is connected to the vertical scanning unit 13 via an address control line 121. The gate of the reset transistor 108b is connected to the vertical scanning unit 13 via a reset control line 123. The address control line 121 and the reset control line 123 are provided for each row of pixels 11.

In this embodiment, description shall be carried out for an example in which the reset transistor 108b is an N-type MOS transistor, the reset pulse included in the reset signal inputted to the gate thereof is a positive pulse (upward pulse), and a trailing edge (back edge) of a reset pulse is a falling edge.

The photoelectric conversion unit control line 131 is common for all the pixels. The column signal line 141 is provided for each column of the pixels 11, and is connected to the horizontal scanning unit 15 via a column signal processing unit 21. The column signal processing unit 21 performs noise suppression processing represented by correlative double sampling, analog/digital conversion processing, and so on, on the signals outputted from the pixels 11 of a corresponding column via the column signal line 141.

Furthermore, when the reset transistor 108b is in a conductive state, the voltage of the charge accumulation region 104 is, for example, 0 V or a positive voltage close to 0 V.

Figure 2:
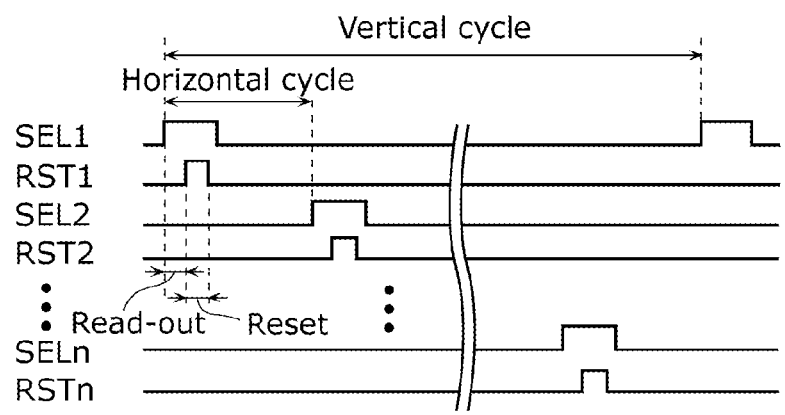
FIG. 2 is a timing chart illustrating operation of the solid-state imaging device according to the embodiment.

FIG. 2 is a timing chart illustrating the most basic imaging operation of the solid-state imaging device according to this embodiment. SEL1 in FIG. 2 denotes a row selection signal of the pixels 11 in the first row. RST1 denotes a row reset signal of the pixels 11 in the first row. SEL2 and RST2 are the same as SEL1 and RST1, respectively, except for the point that the corresponding row is different. One horizontal cycle is the period from a time point at which the row selection signal becomes valid up to a time point at which the row selection signal of the next row becomes valid (from the rise of SEL1 to the rise of SEL2), and is the period required to read out the signal voltage from the pixels 11 in a single row. One vertical cycle is the period required to read out the signal voltage from the pixels 11 in all the rows.

Furthermore, for example, the amplification transistor 108a, the selection transistor 108c, and the reset transistor 108b are formed in the semiconductor substrate which comprises silicon. The amplification transistor 108a has a gate electrode, a drain which is a diffusion layer, and a source which is a diffusion layer. The selection transistor 108c has a gate electrode, a drain which is a diffusion layer, and a source which is a diffusion layer. The source of the amplification transistor 108a and the drain of the selection transistor 108c are formed, for example, by a common diffusion layer. Furthermore, the reset transistor 108b has a gate electrode, a drain which is a diffusion layer, and a source which is a diffusion layer. The amplification transistor 108a and the reset transistor 108b are separated by an element isolation region.

Furthermore, an insulating film is formed above the semiconductor substrate so as to cover the respective transistors formed in the semiconductor substrate. The photoelectric conversion unit 111 is formed above the insulating film. The photoelectric conversion unit 111 includes: a photoelectric conversion film comprising an organic material or a material including a semiconductor as represented by amorphous silicon and germanium, or the like; the pixel electrode formed on the lower face of the photoelectric conversion film; and the transparent electrode formed on the upper face of the photoelectric conversion film. The pixel electrode is connected, via a contact, to the gate electrode of the amplification transistor 108a and the diffusion layer which is the source of the reset transistor 108b. The diffusion layer connected to the pixel electrode functions as the charge accumulation region.

As described above, the solid-state imaging device according to this embodiment uses a photoelectric conversion unit having a large light absorption coefficient, and thus the quantization efficiency is good.

Figure 3:
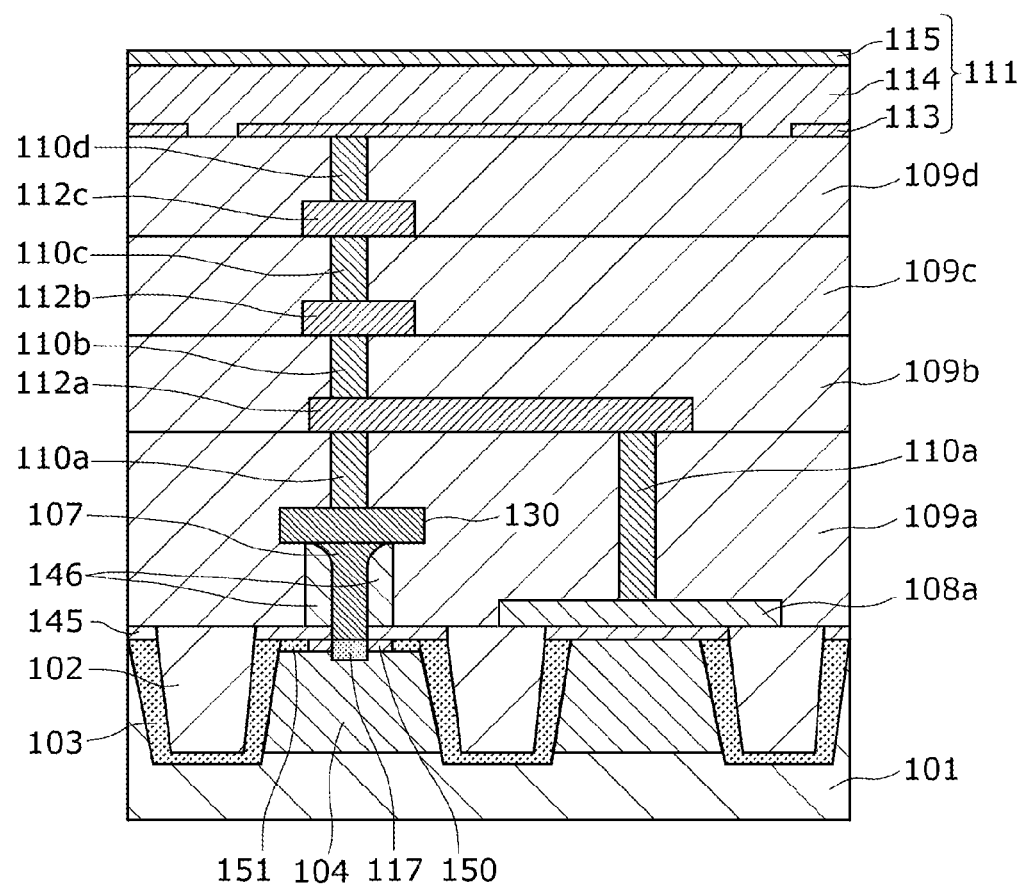
FIG. 3 is a cross-sectional view of the solid-state imaging device according to the embodiment.

FIG. 3 is a cross-sectional view of a configuration including the charge accumulation region 104 and the amplification transistor 108a included in a single pixel 11 of the solid-state imaging device according to this embodiment.

The pixel 11 illustrated in FIG. 3 includes: an element isolation region 102 formed by embedding an oxide film in a semiconductor substrate 101, for separating transistors formed therein; a P-type impurity region 103 formed surrounding the element isolation region 102 to suppress leakage current caused by an interface of the element isolation region 102; an N-type charge accumulation region 104 for accumulating signal charge from a photoelectric conversion film 114; a P-type impurity region 151 formed on the surface of the charge accumulation region 104, in a region that is not in contact with a contact plug 107, and having a conductivity type opposite to a conductivity type of the charge accumulation region 104; the contact plug 107 comprising polysilicon which includes an N-type impurity at a concentration higher than that in the charge accumulation region 104; an N-type impurity region 117 for supplementing the electrical contact between the contact plug 107 and the charge accumulation region 104; a low-concentration N-type impurity region 150 or low-concentration P-type impurity region for mitigating an electric field generated between the P-type impurity region 151 and the N-type impurity region 117; the gate electrode of the amplification transistor 108a formed on the semiconductor substrate 101 with a gate oxide film 145 provided therebetween; metal plugs 110a to 110d which are contact plugs comprising a metal such as W, Cu or Al; wirings 112a to 112c; insulating layers 109a to 109d which include an insulating material such as SiN (silicon nitride); an insulating sidewall 146 which includes, for example, the same material as that of the insulating layers 109a to 109d; a first electrode 113 (pixel electrode) which is separated for each of the pixels 11, and is electrically connected to the charge accumulation region 104 and the gate electrode of the amplification transistor 108a; the photoelectric conversion film 114 for generating a signal charge in an amount corresponding to the amount of incident light; and a second electrode 115 (transparent electrode) for applying to the photoelectric conversion film 114 a predetermined voltage necessary for the photoelectric conversion.

The photoelectric conversion film 114 generates charge in an amount corresponding to the amount of light received. Of the generated charges, the holes are accumulated, as the signal charges, in the charge accumulation region 104 via the first electrode 113. On the other hand, the electrons are discharged to the second electrode 115. A voltage applied to the gate electrode of the amplification transistor 108a increases with the amount of signal charge accumulated in the charge accumulation region 104.

The amplification transistor 108a amplifies the signal charge accumulated in the charge accumulation region 104. The signal amplified by the amplification transistor 108a is outputted to the column signal line 141 by applying a predetermined voltage to the gate electrode of the selection transistor 108c.

Furthermore, voltage of the charge accumulation region 104 is set to a reset voltage supplied from the reset line 126, by applying a predetermined voltage to the gate electrode of the reset transistor 108b after signal read-out.

The solid-state imaging device in this embodiment includes the P-type impurity region 151 formed on the surface of the charge accumulation region 1104, in a region that is not in contact with the contact plug 107, and having a conductivity type that is opposite to the conductivity type of the charge accumulation region 104. With such a configuration, the effect that the leakage current generated at the surface of the semiconductor substrate 101 has on the charge accumulation region 104 is suppressed in the charge accumulation region 104. The charge accumulation region 104 and the metal plug 110a are connected via the contact plug 107 comprising polysilicon doped to $N^+$-type conductivity. Here, in order to prevent difficult electrical contact between the contact plug 107 and the charge accumulation region 104 due to the impact of the P-type impurity region 151, the N-type impurity region 117 is additionally formed in the surface of the charge accumulation region 104, in a region that is in contact with the contact plug 107, by injecting an impurity from a hole used for contact plug forming. In addition, the low-concentration N-type impurity region 150 or the low-concentration P-type impurity region is provided for mitigating the electric field generated between the N-type impurity region 117 and the P-type impurity region 151. Here, the impurity concentration of the low-concentration N-type impurity region 150 is set lower compared to that of the N-type impurity region 117, and compared to when the N-type impurity region 117 and the P-type impurity region 151 are adjacent to each other, the electric field across the P-N junction can be mitigated when the low-concentration N-type impurity region 150 is provided therebetween. Since the electric field across the P-N junction becomes the leakage current generation source, the mitigation of the electric field by the low-concentration N-type impurity region 150 enables suppression of the leakage current.

Furthermore, the P-type impurity region 103 is formed around the element isolation region 102 to prevent leakage current from being generated from the interface of the element isolation region 102. With this configuration, a P-type layer isolates the charge accumulation region 104 from the interface with the element isolation region 102 comprising an oxide film. As such, leakage current generated around the charge accumulation region 104 can be suppressed as much as possible. The P-type impurity region 103 and the P-type impurity region 151 are electrically connected.

Furthermore, in this embodiment, the charge accumulation region 104 which is an N-type impurity region is used for the signal read-out at the holes. With this, a reverse bias voltage applied between the charge accumulation region 104 and the semiconductor substrate 101 intensifies. Accordingly, this structure has the advantage that leakage current does not easily increase compared to that in a method of accumulating electrons in an N-type impurity region, and the advantage that the number of saturation electrons increases.

Furthermore, in this embodiment, a thick polysilicon plug 130 is provided, as an intermediate layer, between the contact plug 107, which comprises polysilicon, and the metal plug 110a. This intermediate layer has the effect of preventing light which has passed through the photoelectric conversion film 114 from directly entering the charge accumulation region 104. This enables suppression of noise. Furthermore, the presence of the thick intermediate layer can also be used in preventing misalignment between the thin plugs. It should be noted that although the contact plug 107 and the polysilicon plug 130 are illustrated distinctly in FIG. 3 for convenience of description, the contact plug 107 and the polysilicon plug 130 are formed integrally in an actual manufacturing process.

Moreover, although polysilicon is used as a material of the contact plug 107 in this embodiment, a material including polycrystalline silicon, Ge, or GaAs may be used instead.

Although the solid-state imaging device in the present disclosure has been described thus far based on an exemplary embodiment, the present disclosure is not limited to such embodiment. Various modifications that can be conceived by those skilled in the art without departing from the teachings of the present disclosure are included in the scope of the present disclosure.

As described above, the solid-state imaging device according to this embodiment is a solid-state imaging device including a plurality of pixels 11 arranged in a matrix, the solid-state imaging device including: a semiconductor substrate 101; a first electrode 113 formed above the semiconductor substrate 101 for each of the pixels 11, and electrically isolated from adjacent ones of the pixels 11; a photoelectric conversion film 114 formed on the first electrode 113, for photoelectric conversion of light into signal charge; a second electrode 115 formed on the photoelectric conversion film 114; a charge accumulation region 104 formed in the semiconductor substrate 101 for each of the pixels 11, and electrically connected to the first electrode 113 in the pixel 11, the charge accumulation region 104 accumulating the signal charge generated through the photoelectric conversion in the photoelectric conversion film 114; a reset gate electrode (gate electrode of reset transistor 108b) formed for each of the pixels 11, for controlling formation of a channel in the semiconductor substrate 101 and resetting a potential of the charge accumulation region 104 of the pixel 11 using charge passing through the channel; an amplification transistor 108a formed for each of the pixels 11, for amplifying the signal charge accumulated in the charge accumulation region 104 in the pixel 11; a contact plug 107 formed, for each of the pixels 11, in contact with the charge accumulation region 104 in the pixel 11, for electrically connecting the first electrode 113 and the charge accumulation region 104 in the pixel 11; a high-concentration impurity region (N-type impurity region 117) formed on a surface of the charge accumulation region 104, in a region that is in contact with the contact plug 107, the high-concentration impurity region having a conductivity type identical to a conductivity type of the charge accumulation region 104; a surface impurity region (P-type impurity region 151) formed on the surface of the charge accumulation region 104, in a region that is not in contact with the contact plug 107, the surface impurity region having a conductivity type opposite to the conductivity type of the charge accumulation region 104; and a low-concentration impurity region (low-concentration N-type impurity region 150) formed on the surface of the charge accumulation region 104, between the high-concentration impurity region and the surface impurity region, and having a conductivity type that is identical or opposite to the conductivity type of the charge accumulation region 104.

By adopting such a configuration, the solid-state imaging device according to this embodiment includes a high-concentration impurity region between the contact plug 107 and the charge accumulation region 104. With this configuration, the contact resistance between the contact plug 107 and the charge accumulation region 104 can be reduced. In addition, the solid-state imaging device includes a surface impurity region which is formed on the surface of the charge accumulation region 104, in a region that is not in contact with the contact plug 107, and has conductivity type opposite to the conductivity type of the charge accumulation region 104. With this configuration, it is possible to suppress the effect that the leakage current generated at the surface of the semiconductor substrate 101 has on the charge accumulation region 104. In addition, the solid-state imaging device includes a low-concentration impurity region which is formed on the surface of the charge accumulation region 104, between the high-concentration impurity region and the surface impurity region, and has a conductivity type that is identical to the conductivity type of the charge accumulation region 104. With this configuration, the electric field generated between the high-concentration impurity region and the surface impurity region can be suppressed, and, in addition, the leakage current brought about by the electric field can also be suppressed. As a result, there is the effect of reducing noise in the sensor.

Furthermore, a concentration of impurity determining the conductivity type of the low-concentration impurity region is lower than a concentration of impurity determining the conductivity type of the high-concentration impurity region and a concentration of impurity determining the conductivity type of the surface impurity region.

By adopting such a configuration, the electric field generated between the high-concentration impurity region and the surface impurity region can be suppressed, and, in addition, the leakage current brought about by the electric field can also be suppressed. Furthermore, the concentration of impurity determining the conductivity type of the low-concentration impurity region is higher than a concentration of impurity determining the conductivity type of the charge accumulation region 104.

By adopting such a configuration, the electric field generated between the high-concentration impurity region and the surface impurity region can be more effectively suppressed, and, in addition, the leakage current brought about by the electric field can also be suppressed.

Furthermore, the signal charge has a polarity opposite to a polarity of majority carriers determining the conductivity type of the charge accumulation region 104.

By adopting such a configuration, it is possible to decrease the reset voltage of the charge accumulation region 104 while maintaining a high saturation signal level, and thus the leakage current under dark condition can be suppressed.

Furthermore, the solid-state imaging device further includes: an element isolation region 102 formed in the semiconductor substrate 101 and comprising an insulator, for isolating the charge accumulation region 104 from a transistor region in which the amplification transistor 108a is formed and a charge accumulation region 104 in an adjacent one of the pixels 11; and an element isolation impurity region (P-type impurity region 103) formed between the element isolation region 102 and the charge accumulation region 104 in the semiconductor substrate 101, and having a conductivity type opposite to the conductivity type of the charge accumulation region 104, wherein the element isolation impurity region has a concentration of impurity that is higher than a concentration of impurity in the charge accumulation region 104.

Here, the element isolation region 102 is a structure which surrounds the amplifying transistor 108a and the selection transistor 108c. Furthermore, the element isolation region 102 is a structure which surrounds the charge accumulation region 104 and the reset transistor 108b. With this, the charge accumulation region 104 is isolated from the charge accumulation region 104 of an adjacent pixel 11.

By adopting such a structure, insulation properties at the element isolation region 102 are ensured, and, in addition, the leakage current generated at the element isolation region 102 comprising an insulator can be suppressed.

Furthermore, the surface impurity region and the element isolation impurity region are electrically connected.

By adopting such a configuration, it is possible to suppress the effects that the leakage current generated at the element isolation region 102 and the leakage current generated at the surface of the semiconductor substrate 101 have on the charge accumulation region 104.

Furthermore, the contact plug 107 includes silicon or germanium.

With such a configuration, a material suited to a silicon process is selected for the material of the contact plug 107 used to terminate interface defects at the surface of the charge accumulation region 104, and thus dark current can be suppressed.

(Manufacturing Method)

The outline of a method of manufacturing the solid-state imaging device according to this embodiment described above shall be described following the cross-sectional views illustrated in FIG. 4A through FIG. 4G.

Figure 4A:
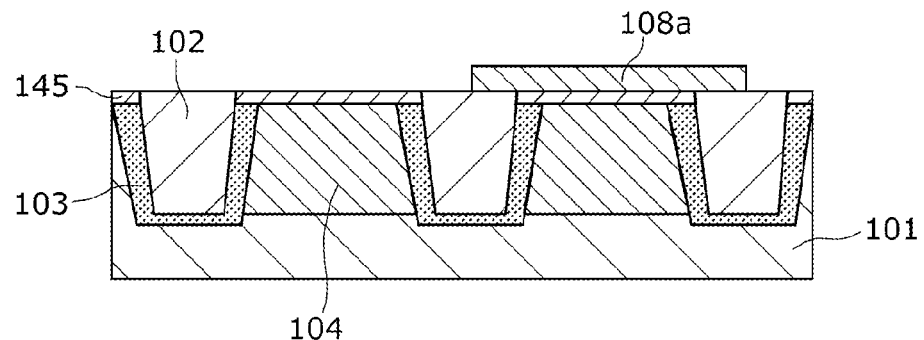
FIG. 4A is a cross-sectional view for describing a method of manufacturing the solid-state imaging device according to the embodiment.

First, as illustrated in FIG. 4A, the element isolation region 102, the P-type impurity region 103 surrounding the element isolation region 102, and MOS transistors (the amplification transistor 108a, the reset transistor 108b, and the selection transistor 108c) each having a gate oxide film 145 and a gate electrode are formed above the semiconductor substrate 101, using a typical method of forming a layered solid-state imaging device. Furthermore, at the same time as the formation of the MOS transistors, transistors included in a peripheral circuit for performing signal processing are also formed. Furthermore, the $N^-$-type charge accumulation region 104 is formed by implanting ions.

Figure 4B:
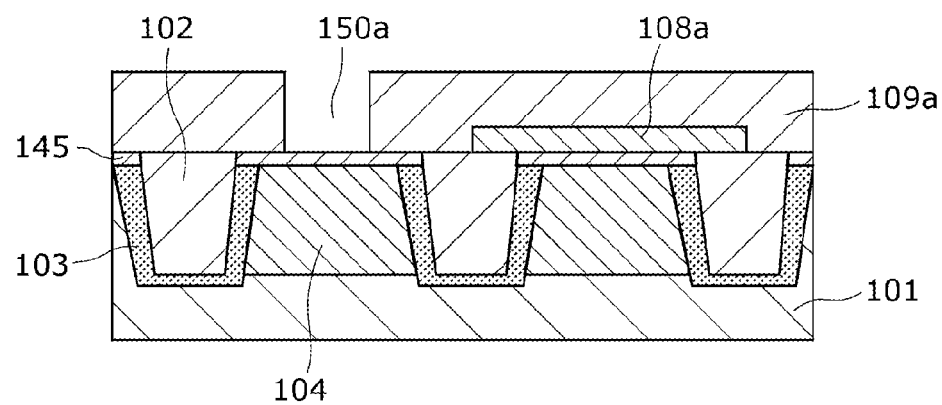
FIG. 4B is a cross-sectional view for describing a method of manufacturing the solid-state imaging device according to the embodiment.

Next, as illustrated in FIG. 4B, the insulating layer 109a is deposited above the semiconductor substrate using a sputtering method or a CVD method. Subsequently, in order to form the low-concentration N-type impurity region 150 in a portion of the charge accumulation region 104, a hole (through hole) 150a is formed in the insulating layer 109a.

Figure 4C:
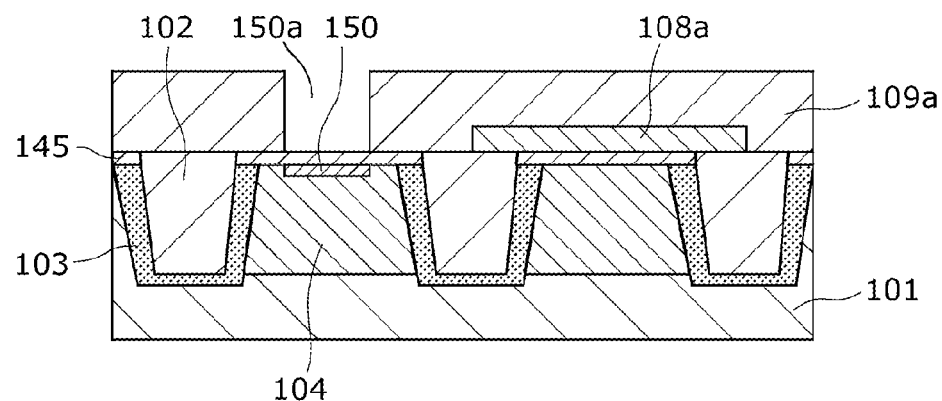
FIG. 4C is a cross-sectional view for describing a method of manufacturing the solid-state imaging device according to the embodiment.

Next, as illustrated in FIG. 4C, an N-type impurity is injected from the hole 150a to a portion of the charge accumulation region 104 to form the low-concentration N-type impurity region 150.

Figure 4D:
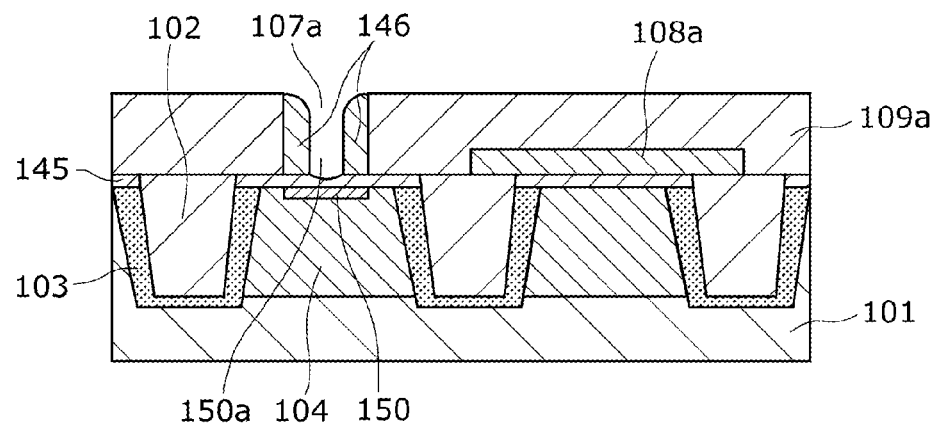
FIG. 4D is a cross-sectional view for describing a method of manufacturing the solid-state imaging device according to the embodiment.

Next, as illustrated in FIG. 4D, a sidewall 146 and a contact hole 107a are formed on the sidewall of the hole 150a, using the same insulating material as that of the insulating layer 109a. The gate oxide film 145 produces the effect of suppressing substrate damage when dry etching is used in the formation of the contact hole 107a, and so on. It should be noted that, in this etching process, there are cases where the gate oxide film 145 below the contact hole 107a has a slight depression.

Figure 4E:
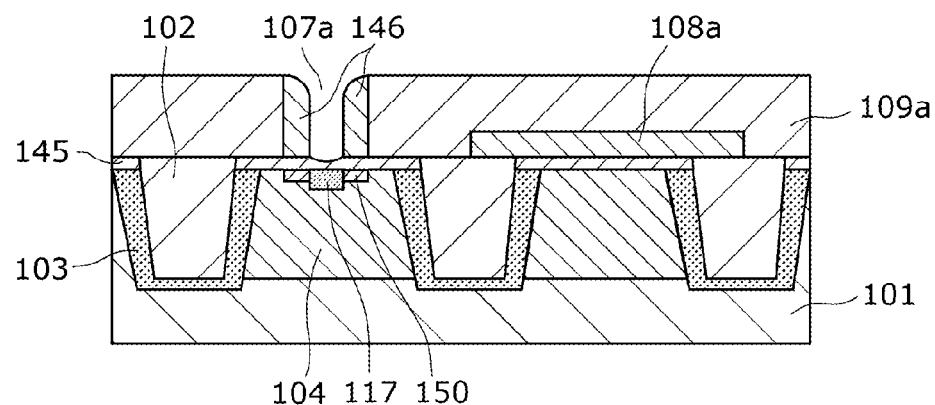
FIG. 4E is a cross-sectional view for describing a method of manufacturing the solid-state imaging device according to the embodiment.

Next, as illustrated in FIG. 4E, the N-type impurity region 117 is formed by injecting an N-type impurity into the charge accumulation region 104 from above the contact hole 107a. In addition, activation annealing is performed on the N-type impurity region 117 to achieve low resistance. In this manner, forming the N-type impurity region 117 using a self-alignment process has the significant manufacturing advantage of allowing mask alignment to be omitted.

Figure 4F:
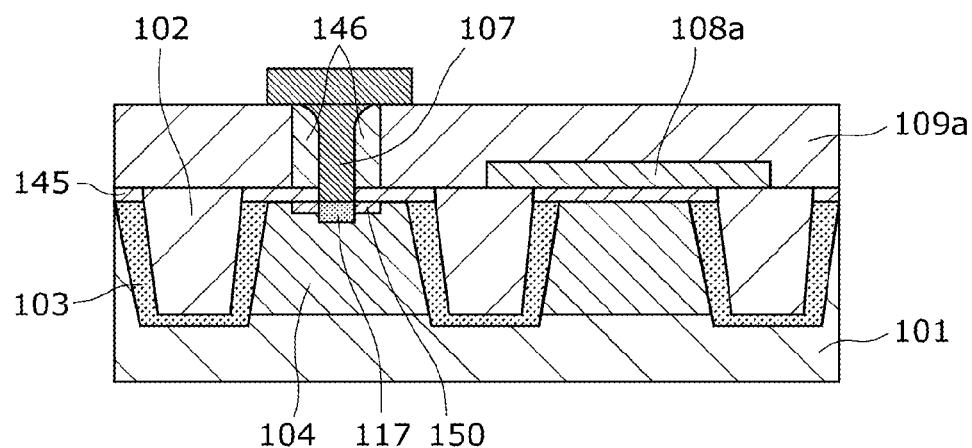
FIG. 4F is a cross-sectional view for describing a method of manufacturing the solid-state imaging device according to the embodiment.

Next, as illustrated in FIG. 4F, after the gate oxide film 145 or a natural oxide film is removed using a dry etching method or a wet etching method, polysilicon having an $N^+$-type impurity is deposited using a CVD method or a sputtering method, and the polysilicon is polished using a chemical mechanical polishing (CMP) method to thereby remove part of the polysilicon while leaving polysilicon in the contact hole 107a. The contact plug 107 is formed by the remaining polysilicon. Since the contact plug 107 is also formed using the self alignment process, mask alignment is unnecessary.

Figure 4G:
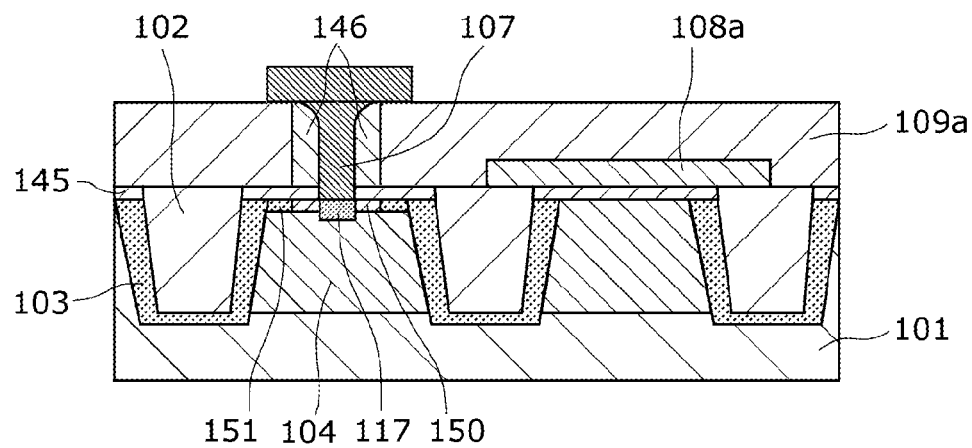
FIG. 4G is a cross-sectional view for describing a method of manufacturing the solid-state imaging device according to the embodiment.

Next, as illustrated in FIG. 4G, a P-type impurity is injected to a portion of the charge accumulation region 104 using a self alignment process to form the P-type impurity region 151. Utilizing a self alignment process has the significant manufacturing advantage of allowing mask alignment to be omitted.

Next, the structure illustrated in FIG. 3 is achieved by forming the metal plugs 110a to 110d, the wirings 112a to 112c, the insulating layers 109b to 109d, the first electrode 113, the photoelectric conversion film 114, the second electrode 115, a protecting film (not illustrated), a color filter (not illustrated), and a lens (not illustrated). It should be noted that the method of manufacturing the above elements are the same as those in a conventional layered solid-state imaging device, and thus detailed description is omitted here.

As described above, the solid-state imaging device according to this embodiment includes: the gate oxide film 145 which is in contact with a portion of the surface of the charge accumulation region 104; and the insulating sidewall 146 which is in contact with the surface of the gate oxide film 145 and a side face of the contact plug 107. By adopting such a configuration, damage to the surface of the charge accumulation region 104 during the dry etching process can be reduced.

Furthermore, after the low-concentration impurity region (low-concentration N-type impurity region 150) is formed, the sidewall 146 is formed, after which the high-concentration impurity region (N-type impurity region 117) is formed using a self alignment process.

By adopting such a configuration, the need to perform mask alignment is eliminated, and variation among elements is reduced.

(Imaging Apparatus)

Hereinafter, an imaging apparatus (camera) using the solid-state imaging device in the foregoing embodiment shall be described.

Figure 5:
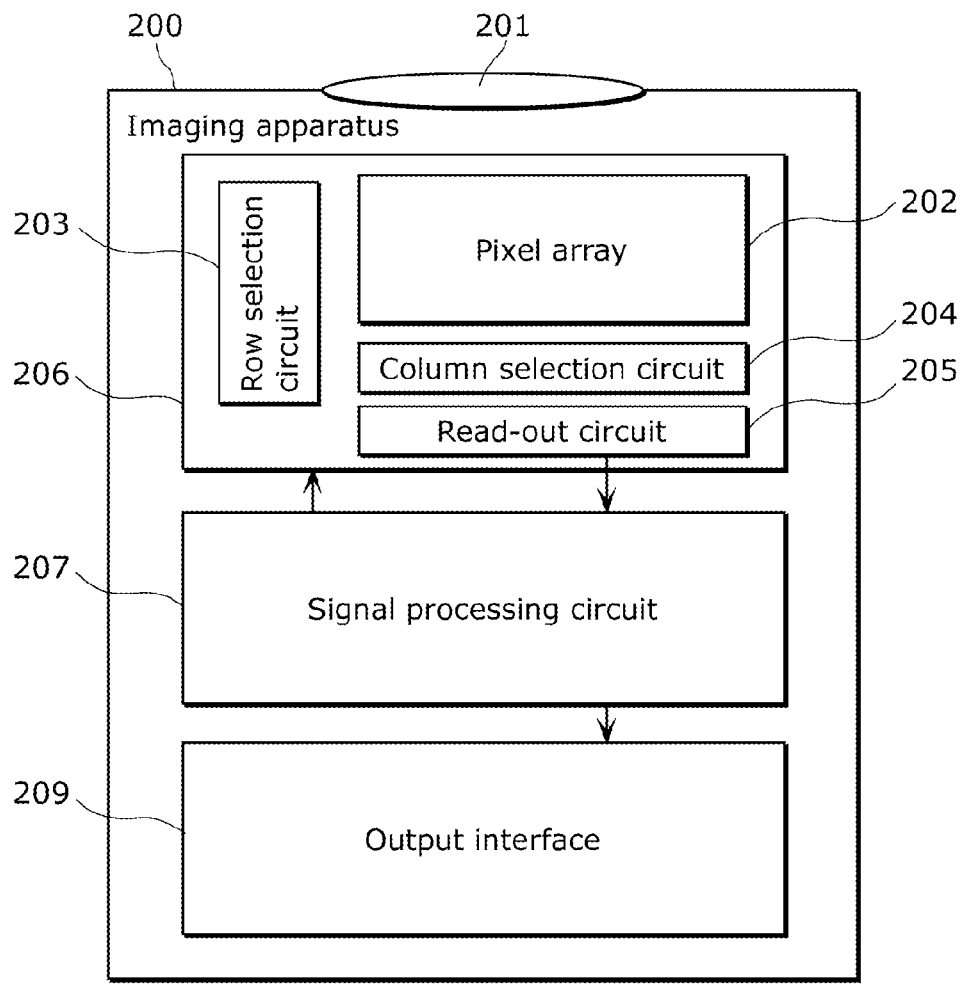
FIG. 5 is a block diagram illustrating an overall configuration of an imaging apparatus using the solid-state imaging device according to the embodiment.
Figure 6:
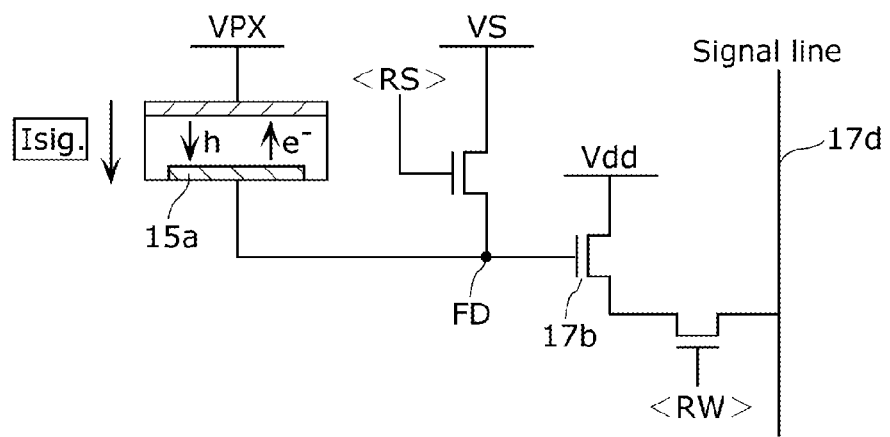
FIG. 6 is a pixel circuit diagram of a conventional solid-state imaging device.

FIG. 5 is a block diagram illustrating an overall configuration of an imaging device 200 using the solid-state imaging device according to this embodiment. The imaging apparatus 200 according to this embodiment includes a lens 201, a solid-state imaging device 206, a signal processing circuit 207, and an output interface 209.

The solid-state imaging device 206 is the solid-state imaging device described in the foregoing embodiment. Furthermore, the above-described pixels 11 are arranged in a matrix in a pixel array 202. A row selection circuit 203 and a column selection circuit 204 correspond respectively to the vertical scanning unit 13 and the horizontal scanning unit 15 illustrated in FIG. 1.

The lens 201 forms an image of a subject on the pixel array 202. The signals obtained through the pixel array 202 are sequentially transmitted to the signal processing circuit 207 via the row selection circuit 203, the column selection circuit 204, and a read-out circuit 205. The signal processing circuit 207 performs signal processing on the received signals, and outputs the resulting image signals to the output interface 209 which includes a display and a memory.

Although the solid-state imaging device and the imaging apparatus according to an exemplary embodiment of the present disclosure have been described thus far, the present disclosure is not limited to this embodiment.

For example, the semiconductor substrate 101 in the foregoing embodiment may be replaced with a well formed in the semiconductor substrate 101.

Furthermore, the solid-state imaging device according to the foregoing embodiment is typically implemented as a large-scale integration (LSI) circuit which is an integrated circuit. The functions blocks may be individually configured as single chips or may be configured so that a part or all of the function blocks are included in a single chip.

Here, the method of circuit integration is not limited to LSIs, and implementation through a dedicated circuit or a general-purpose processor is also possible. A field-programmable gate array (FPGA) which allows programming after LSI manufacturing or a reconfigurable processor which allows reconfiguration of the connections and settings of the circuit cells inside the LSI may also be used.

Furthermore, although the corners and sides of each structural element are drawn linearly in the cross-sectional views in the foregoing embodiment, constituent elements which, due manufacturing issues, have rounded corners and sides are also included in the present disclosure.

Furthermore, the numerical figures used in the foregoing embodiment are all provided as examples for describing the present disclosure, and the present disclosure is not limited to these numerical figures. In addition, the logic levels represented as High/Low levels or the switching sates represented as ON/OFF are provided for as examples to describe the present disclosure, and equivalent results can be obtained through a different combination of the logic levels or the switching states. The N-type, P-type, and so on, of transistors and impurity regions are provided as examples for describing the present disclosure, and equivalent results can be obtained by reversing these types. Furthermore, the materials of the above-described constituent elements are all provided as examples for specifically describing the present disclosure, and the present disclosure is not limited to these materials. Moreover, the connection relationship between the constituent elements is provided as an example for describing the present disclosure, and the connection relationship for implementing the functions of the present disclosure is not limited to this.

Furthermore, the partitioning of function blocks in the block diagrams in the foregoing embodiment is an example, and multiple function blocks may be integrated into a single function block, a single function block may be divided into plural blocks, and part of a function may be transferred to another function block. In addition, the functions of plural function blocks having similar functions may be processed by a single hardware or software through parallel processing or time division.

Furthermore, although examples using MOS transistors are shown in the foregoing embodiment, other transistors may be used.

In addition, various modifications to the embodiment that can be conceived by those skilled in the art, so long as they do not depart from the teachings of the present disclosure, are included in the scope of the present disclosure.

INDUSTRIAL APPLICABILITY

The present disclosure can be applied to a solid-state imaging device. Furthermore, the present disclosure can be applied to an imaging apparatus using a solid-state imaging device, such as a digital still camera, a digital video camera, a mobile phone camera, and a surveillance camera.

The invention claimed is:

1. A solid-state imaging device including a plurality of pixels arranged in a matrix, the solid-state imaging device comprising:
   a semiconductor substrate;
   a first electrode formed above the semiconductor substrate for each of the pixels, and electrically isolated from adjacent ones of the pixels;
   a photoelectric conversion film formed on the first electrode, for photoelectric conversion of light into signal charge;
   a second electrode formed on the photoelectric conversion film;
   a charge accumulation region formed in the semiconductor substrate for each of the pixels, and electrically connected to the first electrode in the pixel, the charge accumulation region accumulating the signal charge generated through the photoelectric conversion in the photoelectric conversion film;
   a reset gate electrode formed for each of the pixels, for controlling formation of a channel in the semiconductor substrate and resetting a potential of the charge accumulation region of the pixel using charge passing through the channel;
   an amplification transistor formed for each of the pixels, for amplifying the signal charge accumulated in the charge accumulation region in the pixel;
   a contact plug formed, for each of the pixels, in contact with the charge accumulation region in the pixel, for electrically connecting the first electrode and the charge accumulation region in the pixel;

a high-concentration impurity region formed on a surface of the charge accumulation region, in a region that is in contact with the contact plug, the high-concentration impurity region having a conductivity type identical to a conductivity type of the charge accumulation region;

a surface impurity region formed on the surface of the charge accumulation region, in a region that is not in contact with the contact plug, the surface impurity region having a conductivity type opposite to the conductivity type of the charge accumulation region; and a low-concentration impurity region formed on the surface of the charge accumulation region, between the high-concentration impurity region and the surface impurity region, and having a conductivity type that is identical or opposite to the conductivity type of the charge accumulation region, wherein the contact plug includes silicon or germanium.

2. The solid-state imaging device according to claim 1, wherein a concentration of impurity determining the conductivity type of the low-concentration impurity region is lower than a concentration of impurity determining the conductivity type of the high-concentration impurity region and a concentration of impurity determining the conductivity type of the surface impurity region.

3. The solid-state imaging device according to claim 1, wherein the signal charge has a polarity opposite to a polarity of majority carriers determining the conductivity type of the charge accumulation region.

4. The solid-state imaging device according to claim 1, further comprising:

an element isolation region formed in the semiconductor substrate and comprising an insulator, for isolating the charge accumulation region from a transistor region in which the amplification transistor is formed and a charge accumulation region in an adjacent one of the pixels; and an element isolation impurity region formed between the element isolation region and the charge accumulation region in the semiconductor substrate, and having a conductivity type opposite to the conductivity type of the charge accumulation region, wherein the element isolation impurity region has a concentration of impurity that is higher than a concentration of impurity in the charge accumulation region.

5. The solid-state imaging device according to claim 1, further comprising:

a gate oxide film which is in contact with a portion of the surface of the charge accumulation region; and a sidewall which is in contact with a surface of the gate oxide film and a side face of the contact plug, and having insulating properties.

6. The solid-state imaging device according to claim 2, wherein the concentration of impurity determining the conductivity type of the low-concentration impurity region is higher than a concentration of impurity determining the conductivity type of the charge accumulation region.

7. The solid-state imaging device according to claim 4, wherein the surface impurity region and the element isolation impurity region are electrically connected.

8. The solid-state imaging device according to claim 5, wherein the high-concentration impurity region is formed using a self alignment process, after the sidewall is formed following the formation of the low-concentration impurity region.

* * * * *